United States Patent
Griffin

(10) Patent No.: US 10,062,453 B1
(45) Date of Patent: Aug. 28, 2018

(54) CALIBRATING I/O IMPEDANCES USING ESTIMATION OF MEMORY DIE TEMPERATURE

(71) Applicant: Toshiba Memory Corporation, Minato-ku, Tokyo (JP)

(72) Inventor: Jason Griffin, Abingdon (GB)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/454,665

(22) Filed: Mar. 9, 2017

(51) Int. Cl.
| | |
|---|---|
| *G11C 7/04* | (2006.01) |
| *G11C 29/50* | (2006.01) |
| *G06F 3/06* | (2006.01) |
| *G06F 13/40* | (2006.01) |
| *G11C 11/406* | (2006.01) |
| *G11C 11/4076* | (2006.01) |
| *G06F 13/16* | (2006.01) |

(52) U.S. Cl.
CPC ........ *G11C 29/50008* (2013.01); *G06F 3/068* (2013.01); *G06F 3/0625* (2013.01); *G06F 3/0634* (2013.01); *G06F 3/0659* (2013.01); *G06F 13/4086* (2013.01); *G11C 11/4076* (2013.01); *G11C 11/40626* (2013.01); *G06F 13/1668* (2013.01); *G11C 2207/2254* (2013.01)

(58) Field of Classification Search
CPC .......................... G06F 13/4086; G06F 13/1668
See application file for complete search history.

(56) References Cited

U.S. PATENT DOCUMENTS

| | | | |
|---|---|---|---|
| 6,507,530 B1 | 1/2003 | Williams et al. | |
| 7,318,130 B2 | 1/2008 | Morrow et al. | |
| 7,688,666 B2 | 3/2010 | Choi et al. | |
| 8,437,171 B1 | 5/2013 | Gilbert | |
| 9,224,451 B2 | 12/2015 | Fujisawa | |
| 9,323,304 B2 | 4/2016 | Salessi et al. | |
| 9,361,985 B2 | 6/2016 | Kim et al. | |
| 9,378,799 B2 | 6/2016 | Kaiwa et al. | |
| 9,502,096 B2 | 11/2016 | Ellis et al. | |
| 9,520,164 B1 | 12/2016 | Yamamoto et al. | |
| 9,531,382 B1 | 12/2016 | Miwa et al. | |
| 9,857,978 B1 * | 1/2018 | Griffin | G06F 3/0604 |
| 2009/0019243 A1 | 1/2009 | Hur et al. | |
| 2016/0182044 A1 | 6/2016 | Addepalli et al. | |
| 2016/0211031 A1 | 7/2016 | Taigor et al. | |
| 2016/0254812 A1 * | 9/2016 | Miwa | H03K 19/0005 326/30 |
| 2016/0284386 A1 * | 9/2016 | McCall | G11C 7/1057 |

FOREIGN PATENT DOCUMENTS

GB     2440657 A     2/2008

* cited by examiner

*Primary Examiner* — Uyen B Tran

(74) *Attorney, Agent, or Firm* — White & Case LLP

(57) ABSTRACT

A memory system includes a calibration engine, a memory, and a memory controller coupled to the memory by a channel used to transmit a plurality of commands from the memory controller to the memory. The memory controller estimates a total energy consumed based on the first plurality of commands in a first sampling period and determines a first temperature change of the memory based on the first total energy consumed. The memory controller transmits an impedance calibration command to the calibration engine if the first temperature change of the memory exceeds a first threshold. The calibration engine changes an impedance of an I/O terminal of the memory based on the calibration command.

20 Claims, 6 Drawing Sheets

US 10,062,453 B1

CALIBRATING I/O IMPEDANCES USING ESTIMATION OF MEMORY DIE TEMPERATURE

FIELD OF THE INVENTION

The present invention generally relates to systems and methods to calibrate I/O impedances using estimations of changes in memory die temperature.

BACKGROUND OF THE INVENTION

Many modern electronic systems employ a volatile memory for temporary storage, caching and buffering, such as a DRAM arranged as a plurality of memory dies organized into banks of devices which process commands. The dies are coupled to a memory controller by a bi-directional memory bus. The memory bus directs commands from a memory controller to the various dies, and directs data from the dies to the memory controller.

Termination resistors on the memory controller-side and on the die-side of the memory bus ensure signaling integrity on the memory bus line. The value of the termination resistors may be altered to change the I/O impedance to maintain signaling integrity over the bus despite changes in the temperature of the die.

In typical systems, the impedances at the I/O channel are recalibrated periodically after a set number of command cycles or a period of time, regardless of the temperature of the memory die and memory controller. This results in over-calibration of the I/O impedance in cases where the temperature of the memory die has not changed sufficiently to warrant a recalibration. Such unnecessary calibration of the I/O impedance uses power and occupies the bus such that no additional commands can be sent to memory dies during the recalibration, reducing the memory I/O performance.

Accordingly, there is a long-felt need to correct the problems inherent to present day systems.

BRIEF DESCRIPTION OF THE INVENTION

In an aspect, a memory system includes a memory, a calibration engine and a memory controller. The memory has an input/output (I/O) terminal that has associated termination impedance. The calibration engine is able to change the termination impedance of the I/O terminal based on an impedance calibration command. The memory controller is coupled to the I/O terminal by a channel, and the memory controller is able to transmit a first plurality of commands over the channel to the memory. The memory controller estimates a first total energy consumed based on the first plurality of commands during a sampling period, determines a first temperature change of the memory based on the first total energy consumed in the first sampling period and a previous total energy consumed in a previous sampling period, and transmits the impedance calibration command to the calibration engine if the first temperature change of the memory exceeds a first threshold.

In another aspect, a method of calibrating I/O impedances using an estimation of temperature includes using a memory controller to record a tally of commands transmitted to a memory within a sampling period, to receive a signal that the sampling period is complete, to determine a total energy consumed associated with the transmitted commands in the tally, and to determine a temperature change based on the total energy consumed compared to a previous total energy consumed in a previous sampling period. If the temperature change exceeds at least one threshold value, the method further includes transmitting a calibration command to a calibration engine if the temperature change exceeds at least one threshold value.

DETAILED DESCRIPTION OF THE INVENTION

Figure 1:
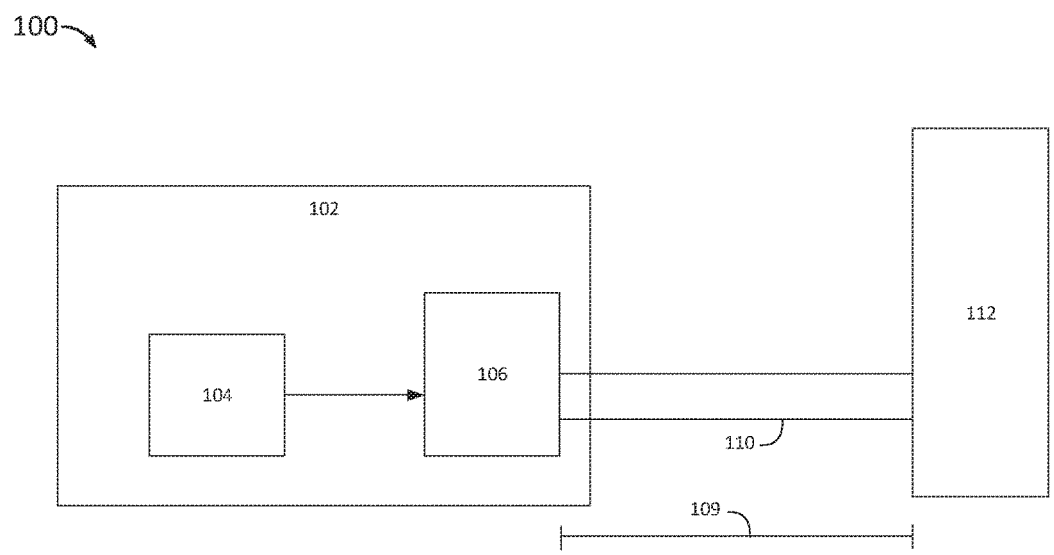
FIG. 1 shows a block diagram of a memory device including a controller, according to an embodiment.

FIG. 1 shows a block diagram of a memory device system 100 including a controller 106 coupled to a memory device 112. An application-specific integrated circuit (ASIC) 102 includes a central processing unit (CPU) 104, a memory controller 106. The memory controller 106 is coupled to the memory device 112 by a memory bus 110.

The memory controller 106 is part of an ASIC 102 which provides access from a CPU 104 or other entity (for example, a processor) on the ASIC 102 to an external memory device 112. The external memory device may be DRAM or any other high speed memory technology. The memory controller 106 is attached to the memory device 112 over a high speed bus 110. The memory controller 106 is contained within an area of the ASIC 102 die which operates at a temperature Tmc. The temperature Tmc may be different than a temperature on other parts of the die, particularly if the die is large, such as the CPU 104. The memory device 112 operates at a temperature Tme. The temperature Tme, and the temperature Tmc, is changed by the processing of commands at the memory device 112 and the controller 106, respectively.

The CPU 104 or other entity issues commands to the controller 106, such as read and write commands. The controller 106 sends data to the memory device 112 from the CPU 104 and receives data from the memory device 112 to the CPU 104. The controller 106 sends the data to the memory device 112 over the memory bus 110 which has an associated length 109.

For clarity, a single memory device 112 is shown attached to the ASIC 102 by the memory bus 110. However, multiple memory devices may be coupled to the ASIC 102 on the same memory bus 110. Each of the multiple memory devices may have a different bus track length to the controller 106. Further, each of the multiple memory devices may have a different associated temperature (for example, Tme 1, 2, 3 etc.). Where the memory device temperature change is tracked, this will be on a per-physical rank basis.

As a die processes a set of commands, the die temperature changes according to whether the heat generated in processing the commands is greater or less than the die's capability to dissipate heat. If the heat generated exceeds the heat dissipated, the temperature will rise; if the heat dissipated exceeds the heat generated, the temperature will fall. Each command has an associated amount of heat generated by the memory die and the die will have a certain amount of heat dissipation determined by its packing within the memory device. The same effect may be observed in the processing of memory commands sent to the memory die by the memory controller driving the memory I/O bus. Any temperature changes may be sufficient to require that the bus termination impedances be recalibrated at both ends of the I/O channel (at the memory controller and at the memory die) in order to optimize the signal integrity and power consumption. If the bus termination impedances are not recalibrated periodically, it can result in data loss over the channel. The temperatures of the physical layer (PHY) in the memory controller and memory device die have a direct effect on the matching of the impedances of termination resistors on the memory bus lines and any mis-match may cause less than optimal I/O signaling at the operating temperature of the memory device and memory controller.

Figure 2:
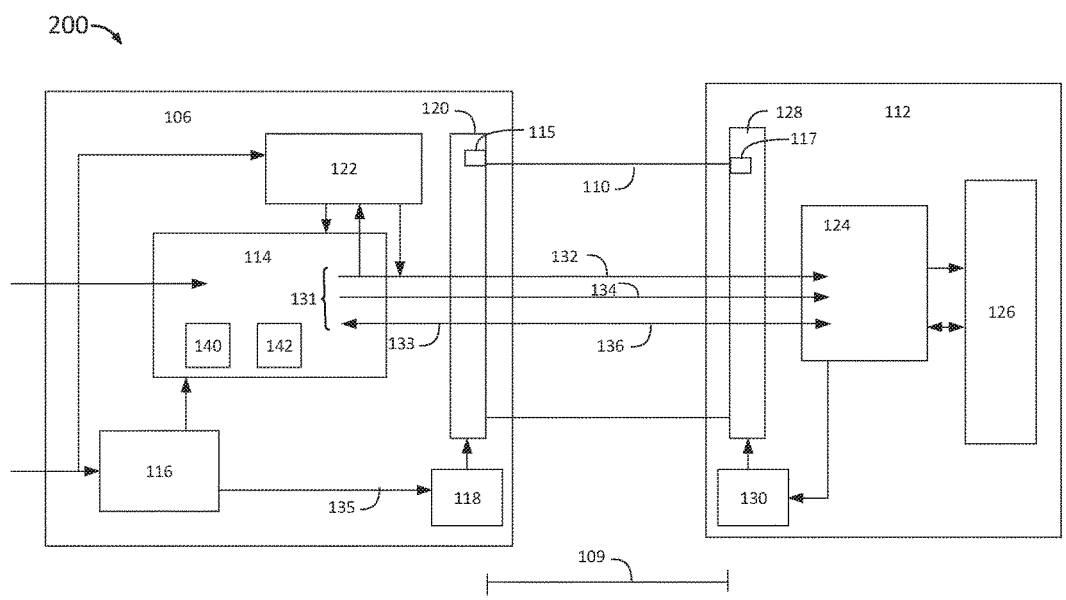
FIG. 2 shows a detailed enlargement of the memory controller and memory device of FIG. 1; according to an embodiment.

FIG. 2 shows a detailed enlargement of the memory controller 106 and memory device 112 of FIG. 1. The memory controller 106 includes a command parser engine 114, an I/O driver 120 (and controller-side termination point) for the memory bus 110, a local I/O calibration engine 118, a memory device command tally engine 122, and a local command tally engine 116. The memory device 112 includes an I/O driver 128 (and device-side termination point) for the memory bus 110, a memory cell array controller 124, memory cell array 126, and a memory I/O calibration engine 130.

The memory bus 110 is a bi-directional bus connected to the memory device 112 at an I/O terminal. At the memory controller 106 output drivers 131 are connected to the lines of the memory bus 110 to output data to the memory device 112. The output drivers 131 include a driver to output an address and commands to the memory device 112. For example, bus line 132 outputs memory commands to the memory device 112, and bus line 134 outputs an address to the memory device 112. Input receivers 133 are connected to the bus lines of the memory bus 110 to receive data from the memory device 112. For example, data is received at the memory controller 106 over bus line 136.

Similarly, the memory device 112 has an I/O driver 128 which includes receivers to receive the commands, addresses, and data from the memory controller 106 and to output data back to the controller 106 (for example, output data over bus line 136 to the memory controller 106). The high speed memory bus 110 behaves like a transmission line. To ensure that signal integrity is maintained over the lines of the memory bus 110, termination resistors 115 and 117 are positioned at each end of the memory bus 110 lines. The termination resistors 115 are positioned at the memory controller 106 side and the termination resistors 117 are positioned at the memory device side 112.

The actual value of termination resistors 115 and 117 (measured as impedances) depends on the bus length 109 (and on the route taken by the memory bus 110 on the circuit board) and the temperature of the physical layer (PHY) in the memory controller 106 and memory device 112. To ensure signal integrity, the impedances must be matched accurately to the PHY temperature. To do this, the PHY at both the memory controller 106 and the memory device 112 has an I/O calibration (local and memory I/O calibration) process using the local I/O calibration engine 118 and memory I/O calibration engine 130 which use a precision resistor reference to correctly set the memory bus termination impedances. Local I/O calibrations are sent from the local command tally engine 116 to the local I/O calibration engine 118 over a sideband interface 135. I/O calibrations to the memory device 112 are sent via special commands over the command bus 132. During the calibration of the termination resistors, the memory bus 110 is not available for use.

It is therefore advantageous to minimize the recalibrations that are performed as each recalibration (at either end) occupies the bus exclusively during the calibration and also consumes additional power.

In some cases, by default, a fixed interval is set for a re-calibration to be performed in case the temperature of the controller (Tmc) or the temperature of the memory device (Tme) has changed. This background recalibration process happens irrespective of the actual temperatures, and is prompted by a timer that indicates a specified or programmed time has elapsed since a last calibration. The controller 106 may include a timer which is used to perform periodic calibrations of the memory or local I/O impedance to account for voltage and temperature (VT) drift caused by various mechanisms. A recalibration of the I/O impedance resets the timer.

The first programmable timer 140 causes these periodic calibrations to memory (known as ZQC commands). The second timer 142 causes calibrations of the local I/O impedance on the memory controller. This sets the background rate to cover external influences on VT-drift. The output of the memory device command tally engine 122 and the local command tally engine 116 is input to the timers to reset them and cause an immediate calibration (in the memory and/or local). An additional output is used to determine the type of recalibration, whether it will be a long calibration command or a short calibration command (e.g. ZQCS/L).

In some implementations, the memory device command tally engine 122 and the local command tally engine 116 are combined into a single engine including at least two timers. The timers allow the local controller and the memory device background I/O calibrations to operate with independent rates. The tally engines can be combined because both the local PHY and I/O and the memory device receive the same commands from the CPU or other entity.

Since the re-calibration is required if there has been a drift in temperature of the memory device 112 or the memory controller 106, if the temperature of the controller PHY and the device PHY can be determined, recalibrations of the termination resistors 115 and 117 can be implemented when they are required (i.e., when the temperatures drift by a sufficient amount). Some memory bus standards, for example, DDR4, offer a temperature range indication (up to 85° C.; between 85° C. and 95° C.) but this is not granular or accurate enough to indicate when recalibration should occur. A temperature sensor of the ASIC may provide an indication of the CPU (core) temperature or the ambient temperature, but the portion of the PHY that comprises the die provides the most accurate temperature.

Therefore, to estimate the temperature of the portion or area of the ASIC die that includes the memory controller 106 and its PHY and I/O drivers, the power or heating effect of the commands sent to the controller 106 is calculated by tallying the commands over a sampling period. The commands sent from the CPU 104 or other entity to the controller 106 are tallied in the local command tally engine 116. Commands sent from the controller 106 to the memory device 112 are tallied in the memory device command tally engine 122 on a per-physical rank basis. As described above, in some implementations the memory device command tally engine 122 and the local command tally engine 116 are combined into a single engine. For each command executed within a sampling period, the current consumed and the time period of the command are integrated (approximated by average or peak/burst current multiplied by the command period time) and tallied to estimate the energy input which will be directly proportional to the temperature rise, delta Tmc at the controller. The same calculation can be performed for the current consumed in time period of the command to determine the temperature rise of the memory device, delta Tme. The difference between this delta and the previous delta in the previous sampling period is calculated and if the magnitude of this difference is greater than a threshold, a local I/O recalibration command is sent to the local PHY via a sideband interface 135 (i.e. separate to the normal memory commands and data/address interface) and/or a memory device I/O recalibration is sent via a special command (such as ZQC).

The current consumed by each of the commands may be determined from manufacturer specifications. Although the consumed current recorded in a manufacturer specification is typically representative of a maximum (peak/burst) current during the processing of a command, this value gives a reasonable approximation of an upper limit of the energy consumed during the period of processing of a command by DRAM. In some implementations, if a more precise estimate of the consumed current is available, for example as a profile of current over time, the more precise current estimate may be used.

Similarly, a time period over which the command is processed may be determined from manufacturer specifications. By multiplying the time period of the command and a current consumed by the memory device 112 during processing, a power consumption or energy input, or total energy consumed, may be calculated. The energy input is directly proportional to the temperature rise of the die (delta Tmc) or device (delta Tme).

The temperature rise may be further refined to account for heat dissipation during idle periods of the memory controller or memory device (or power down or self-refresh periods). If no commands are sent, the memory controller 106 is idle and will tend towards an idle state temperature which is related to the ambient temperature and the overall ASIC die temperature.

Once a temperature rise, delta Tmc, for the sampling period is determined, the delta Tmc is compared to a previously determined and stored temperature rise. The difference between the determined delta Tmc and the previous delta Tmc, |ΔT|, is compared to a threshold. If the absolute value of the difference is greater than a threshold amount, a recalibration of the termination resistors 115 and 117 is triggered. If the absolute value of the difference is less than a threshold amount, background recalibrations may continue at the normal rate, but the difference does not trigger a temperature based recalibration of the I/O impedance.

The power consumed by individual DRAM commands within a sampling period is tallied at the memory device command tally engine 122. There are five basic DRAM commands, including Activate (ACT), Precharge (PRE), Read (RD), Write (WR), and Refresh (REF).

In the ACT command, an entire row of data is read from the memory cell array 126 and stored in the row buffer. In PRE, the contents of the row buffer are written into the memory cell array 126. In RD, the row buffer contents are read and output to the I/O lines of the memory device 112. In WR, the data on the I/O lines is written into the row buffer.

The ACT command occurs over a period of time tRAS (Row Access Strobe) which is specified and published by the DRAM manufacturer. The PRE command occurs over a period of time tRC (Row Cycle Time)—tRAS. Typical values might be 32 ns for tRAS, 46 ns for tRC. The REF cycle lasts for tRFC, which may typically be any of 160, 260, 350 or 550 ns, depending on the DRAM die capacity (for DDR4 2 Gb, 4 Gb, 8 Gb, or 16 Gb, as an example).

A current consumed by the ACT and PRE commands is Idd0. A typical value for Idd0 is 60 mA. The power consumed by an ACT command is therefore proportional to 60×32=1920. The power consumed by a PRE command is proportional to 60*(46−32)=840.

A burst (peak) current consumed by the WR command is Idd4w, a typical value of Idd4w being 150 mA. The WR command typically takes 4 clock cycles, or for a typical clock cycle time of 1 ns, the WR command takes 4 ns to complete. The power consumed by a WR command is therefore proportional to 150*4=600.

Idd4r is the burst (peak) current consumed by execution of the RD command. A typical value of Idd4r is 130 mA. The RD command typically takes 4 clock cycles, or for a typical clock cycle time of 1 ns, the RD command requires 4 ns to complete. The power consumed by a RD command is therefore proportional to 130*4=520.

Idd5 is the burst (peak) current required to execute the REF command, and is typically about 170 mA. The maximum power consumed by the REF command in refreshing a die is proportional to 170*550=93,500.

Similar calculations may be used for less frequently issued commands, such as ZQC (the ZQ Calibration, for re-calibrating the I/O driver termination impedance values). The idle state may be approximated by assuming a minimal power proportional to an I*t value of 1, as an example.

Calculating the power consumption of each of the commands enables a tally of the total power consumed to be kept during the sampling period, the total power consumed being proportional to the temperature rise of the die. At the end of the sampling period, any dissipation of temperature is accounted for (or may be discounted since this factor is eliminated when the difference between two successive tallies is determined), and the change in temperature is compared to a previous temperature change in a previous sampling period. The difference between the two values is compared to a threshold to determine if the I/O impedance should be recalibrated.

The recalibration of the I/O impedance as a result of rising or falling temperature on the die allows the I/O impedance to be recalibrated more often when the temperature of the die is changing between sampling periods, and less often when the temperature is not changing. This conserves power by not executing unnecessary calibrations, and also leaves the memory bus available for transmission of data, commands, and addresses. By recalibrating the I/O impedance based on an approximation of the temperature the recalibration can be more nuanced and signaling of the bus is optimized.

Figure 3:
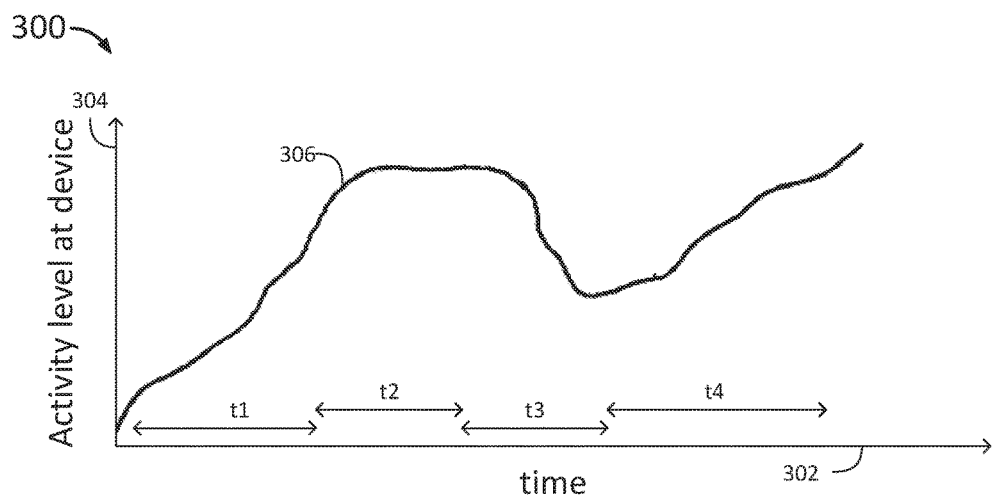
FIG. 3 shows a plot of the activity level at a memory die, according to an embodiment.

FIG. 3 shows a plot 300 of the activity level at a memory die, such as the memory device 112 of FIGS. 1 and 2. The plot 300 includes an x-axis 302 representing time and a y-axis 304 representing an activity level of the device. The activity level of the device over time is represented by the trace 306. The activity level of the device 306 may include the tallied power consumed by the device in executing commands within a sampling period or number of sampling periods.

The plot 300 shows a notional measure of the activity level (or traffic) over time at a memory device. The activity level is proportional to the temperature of the memory device or the memory controller. The activity level is also proportional to the temperature of the surrounding die around the memory controller to an extent.

The plot 300 shows a first period t1 of increasing activity level, followed by a period t2 of generally stable activity level. This is followed by a third period t3 of decreasing activity level at the memory device, and finally a fourth period t4 of increasing activity level. The activity level is accumulated per-physical rank.

Figure 4:
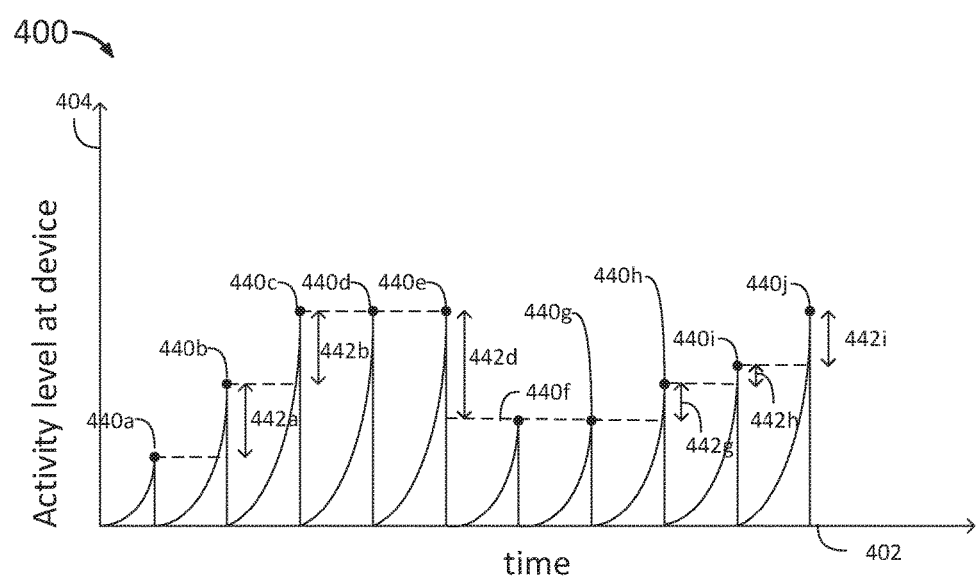
FIG. 4 shows a plot of the changes in activity level at a memory die over a series of sampling periods, according to an embodiment.

FIG. 4 shows a plot of the activity level of a memory die illustrating the method of calculating the change in temperature of the memory die over a series of sample periods. The plot 400 includes an x-axis 402 representing time, and a y-axis 404 representing an activity level of the device. The activity level is a measure of the value being accumulated in the accumulator (such as engines 122 and 116 in FIG. 1) on the memory controller. The activity level of the device is tallied at the end of each sampling period, and is illustrated by the vertical lines 440 a-j. The comparison of the activity in a first sampling period to a subsequent sampling period is illustrated by the delta T values 442 a-i.

The vertical lines 440 a-j are equally spaced in fixed sampling periods. The weighted contributions (WC) from commands and from periods in which the device is idle are added to the current value of the accumulator every sampling period, and a heat dissipation value is subtracted every cycle of the sampling period.

The change in activity level between sampling periods is shown by the double-sided arrows representing the difference delta T 442a-i between activity levels tallied in subsequent sampling periods.

The plot 400 generally follows the same activity level changes as in plot 300 of FIG. 3. The activity level tallies measured in a first time period t1 are increasing, such that, for example, vertical line 440b is higher than vertical line 440a immediately preceding it. The delta T value illustrated by 442a shows this difference between the activity level for a first time period 440a and a second time period 440b. There are very small or no changes in activity level between 440c, 440d, and 440e. From the sampling period illustrated by vertical line 440e there is a sharp decrease in activity level for the subsequent sampling period 440f. After 440g the activity level rises again.

The activity level is proportional to the temperature of the controller or the memory die. Over the course of a sample period the trend of the activity level will be up and to the right if commands are issued to the memory device at a rate that provides an energy accumulation greater than the heat dissipation. At the end of the sample period the final value is subtracted from the previously stored sample period and the magnitude of the difference is tested against a threshold. The values of the previous stored sample period will be zero at reset. The threshold may be programmable. If the difference exceeds the threshold, a calibration update is scheduled and the final value for the most recent sample period is used as the previous sample for comparison to the value tallied in the next sampling period. If the first threshold is not exceeded, then no calibration is requested and the sample for future comparisons is not updated.

In some implementations, the difference is also compared to a higher, second threshold. If the difference exceeds the higher, second threshold then a "stronger" calibration update is triggered instead. In implementations in which the memory is DDR3 or DDR4, this can correspond to a short or long calibration command (e.g., a ZQCS or ZQCL calibration).

Time periods 440e and 440f, for example, illustrates a case in which a difference in activity level between sampling periods triggers a recalibration. As there is no change in activity level between time periods 440c and 440d, for example, these sample periods illustrate a case in which the difference in activity level is not sufficient to trigger a recalibration. Using the determined activity level, proportional to the temperature of the die, in determining whether to calibrate the I/O impedance value of the termination resistors is an efficient use of power. The I/O impedance value is only updated when it is warranted by a change in temperature greater than a set threshold value, and unnecessary recalibrations are avoided.

Figure 5:
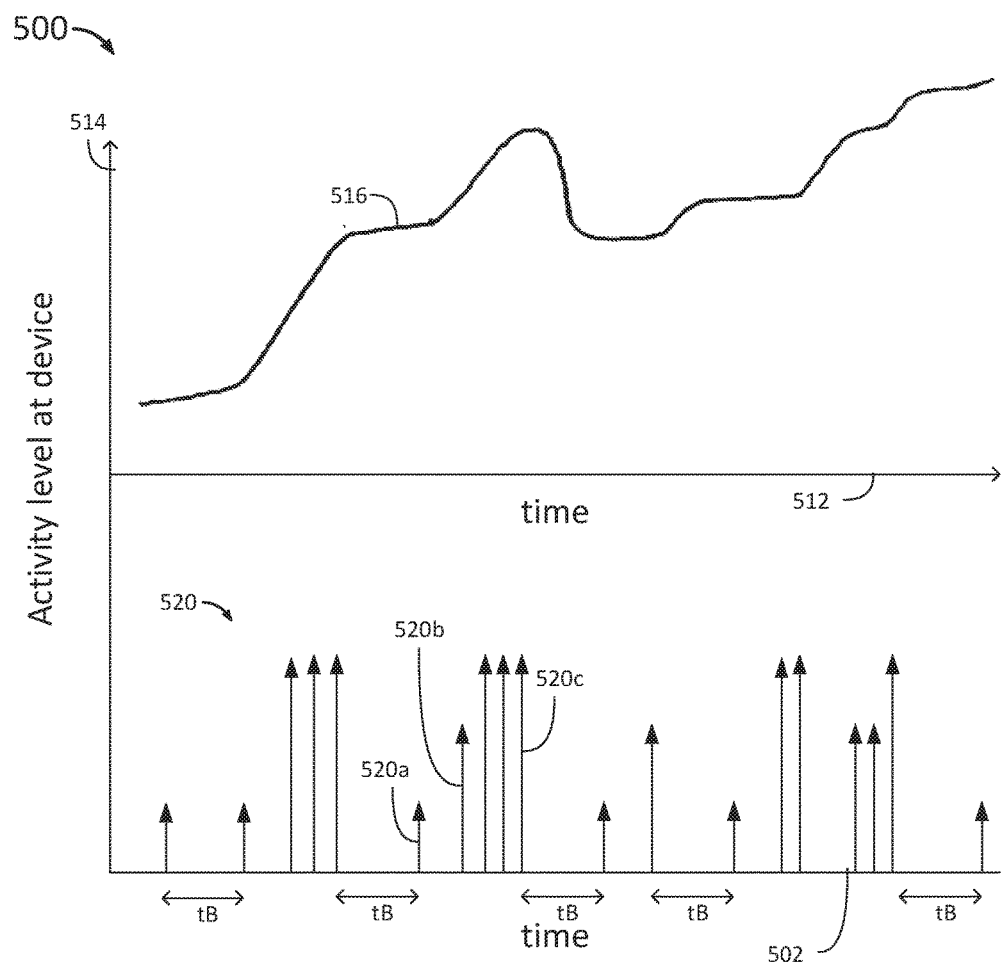
FIG. 5 shows a plot of activity values for a memory die and associated calibration events, according to an embodiment.

FIG. 5 shows a plot 500 of activity values for a memory die stored in the accumulator over several sampling periods. The plot 500 shows the process over a longer period of time than in FIGS. 3 and 4.

The plot 500 includes a first x-axis 502 representing time on which vertical arrows 520 indicating calibrations are depicted. The plot 500 also includes a second x-axis 512 representing time and a y-axis 514 representing an activity level of a memory device on which a trace 516 of the activity level over several sampling periods is depicted.

The arrows 520 indicate calibrations performed in response to the activity levels of the memory device (shown in trace 516), and also show calibrations which are performed periodically. The background periodic calibration, illustrated by short vertical arrows, occurs every tB after the last calibration to adjust for VT-drift caused by other effects, such as ambient temperature changes caused by other means. For example, arrow 520a depicts automatic periodic calibration which is performed on a time schedule (tB) and does not depend on temperature determinations. Arrow 520b depicts a ZQCS calibration, as it corresponds to a change in temperature between sampling periods which exceeds a first threshold. Arrow 520c depicts a ZQCL calibration, as it corresponds to a change in temperature between sampling periods which exceeds both the first threshold and a second higher threshold.

Plot 500 shows that when the activity level (to the memory) starts to increase, the recalibration procedure yields additional calibrations to adjust for the corresponding heating effect on the memory. Each calibration issued by this means will reset a timer used for the periodic background calibrations. Whenever there is a change in activity level (increased or decreased) a flurry of calibrations will occur. The gradient of the change will determine the rate and type of calibration. A low gradient results in fewer, less frequent updates, tending to the background rate. A high gradient results in more, more frequent updates. The number and frequency of calibrations tracks the activity level of the memory based on the estimated temperature effect of that activity level, allowing the recalibration of the I/O impedances to be better suited to the temperature needs of the memory device.

Figure 6:
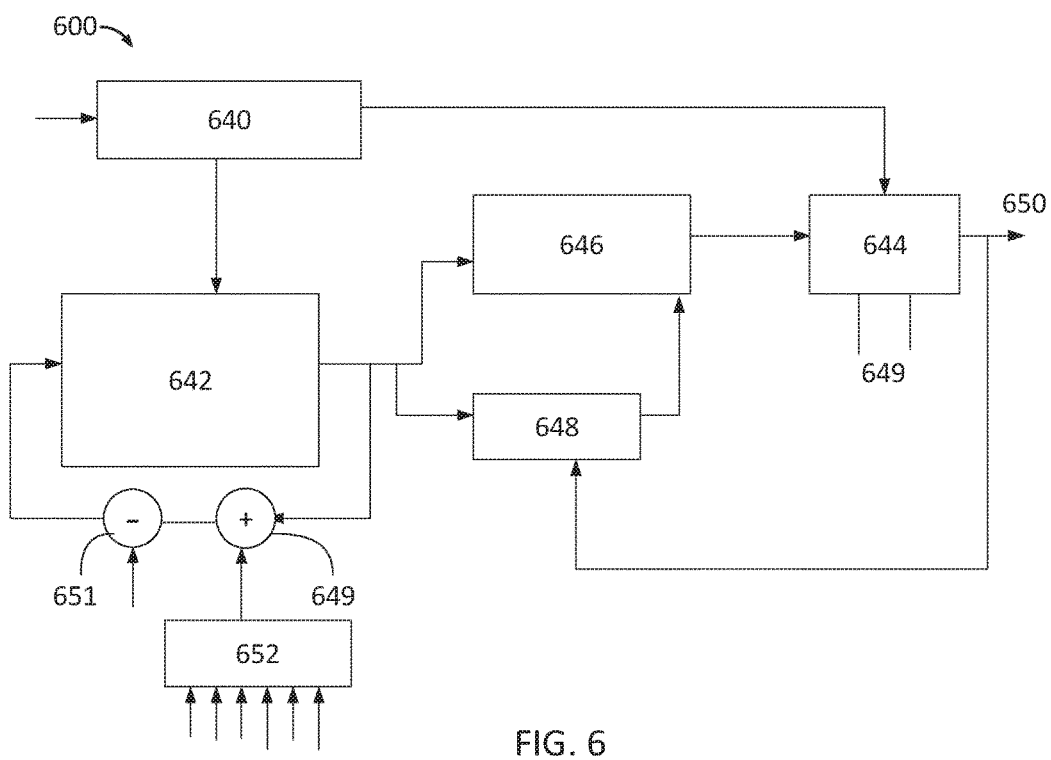
FIG. 6 shows a block diagram of the usage of an accumulator in a system, according to an embodiment.

FIG. 6 shows a block diagram 600 of the usage of an accumulator in a system. The block diagram 600 includes a programmable timer or counter 640 set to the sampling period as either a length of time or a number of commands to be executed. The timer 640 signals the accumulator when the time period or number of cycles is complete for a sampling period. The accumulator tallies the commands 652 which are executed in the sampling period and determines a power consumed for each command by multiplying the programmed current by a time to execute the command. By summing the weighted contribution for each command in the cycle 649 and subtracting a heat dissipation factor 651, the accumulator determines an energy consumption over the sampling period which is proportional to the temperature rise during the period. The activity level is accumulated on a per-physical rank basis.

The temperature rise is compared 646 to a previous sample temperature rise 648 determined during a prior sampling period, to determine an absolute change in temperature, power or activity level (proportional to temperature). The difference in temperature is then compared 644 to one or more thresholds 649, which determine a) whether a recalibration is necessitated by the change in temperature during the sampling period and b) what kind of recalibration will be performed (ZQCS or ZQCL). Once the recalibration type is determined, the calibration request 650 is sent to an appropriate calibration engine and the I/O impedance of the terminating resistors is recalibrated.

The contribution per cycle of a particular type of command can be used in the accumulators determination of an activity level or power usage over a sampling period. Alternatively, a weighted contribution in a single cycle can be used at the point the command is issued. The current usage from a command can be determined with the weighted contribution by calculating the contribution multiplied by a command time. At the end of the command time, the net effect of using a contribution over the cycle or a weighted contribution are the same, but the implementation differs slightly. For example, for the REF command IDD(REF) is accumulated for as many cycles (nRFC) that cover the refresh time (tRFC), or IDD(REF)*nRFC is applied at the point the refresh command is issued with the knowledge that no other command will be issued to the same rank for at least tRFC. Idle periods or periods of power down or self-refresh are applied for every cycle that they last, because there is no command time for execution associated with these commands and they are variable length of execution. A heat dissipation value or factor is subtracted every cycle to accommodate for heat dissipation during the sampling period. The heat dissipation value is programmable. The command contribution per-cycle and/or weighted contribution may also be programmable.

Although the calibration of I/O impedance values has been discussed in regard to DRAM memory, in some implementations, the recalibration procedures be used with DDR3, DDR4, or SDRAM memory and potentially the controller side I/O (PHY). The procedure can equally be mapped to any other type of technology that supports impedance calibrations.

In this way, recalibration is only performed when the energy input in a sampling period is substantially changed from the previous period by some threshold amount, which will equate to a temperature drift (plus or minus) greater than a threshold known to require an impedance recalibration.

Similarly, the commands that are sent by the memory controller to the memory device in consequence to the R/W commands from the host, as well as other management commands such as refresh, idle, power down etc., are tallied. In this case it is the current consumed by the memory device and the time period of the command to be executed in the device that is tallied. This forms an estimate of the energy input to the memory device over the sampling period and the difference between this energy input and the previous energy input of the previous sampling period will form an estimate of the temperature rise (or fall) in the device. If the difference is greater than a threshold, then the memory controller will issue a ZQC (recalibrate I/O impedance) command to the memory device, which will act upon it within its own memory cell array controller and cause an I/O recalibration to be performed in the memory device.

Figure 7:
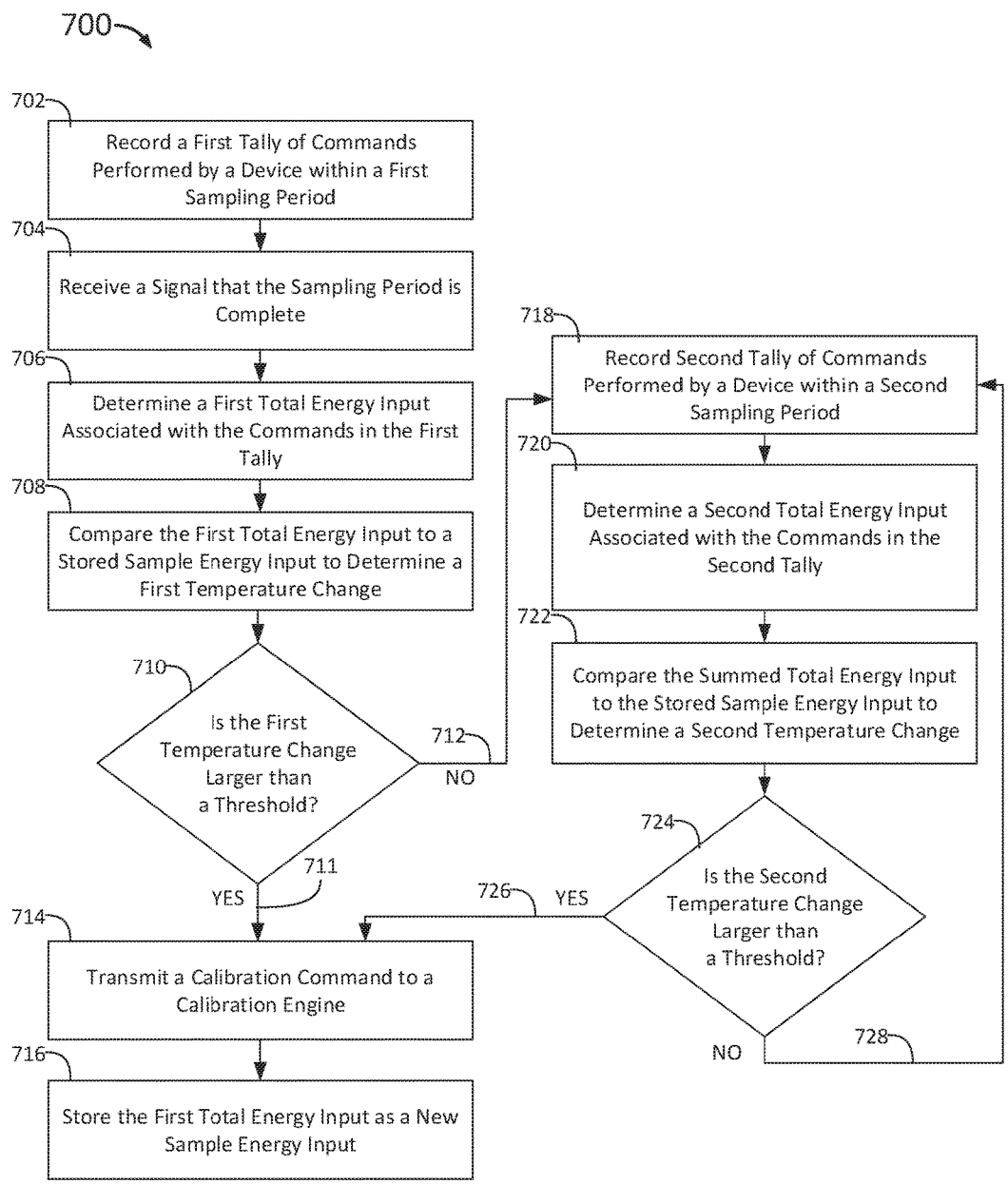
FIG. 7 shows a decision chart for the recalibration of an I/O impedance for a memory die, according to an embodiment.

FIG. 7 shows a decision chart 700 for the recalibration of an I/O impedance for a memory die.

At step 702 the accumulator in a controller records a tally of commands executed by a device in a sampling period on a per-physical rank basis. The tally may include a record of the number of each type of command executed by the memory device.

At step 704 the accumulator receives a signal that the sampling period is complete. The sampling period may be measured as a programmable period of time or number of cycles. Once the sampling period is complete, at step 706 the accumulator determines a total energy input associated with the executed commands in the tally. This may be determined by multiplying a known average (or peak) current for a particular command by the time in which the command is executed. Both the average (or peak) current for commands of different types and the time for the command to be executed may be programmed and may be found in a manufacturing specification for the device. The average current and the time for execution of the command give an estimated energy input value or power consumed during the execution of the command. This is proportional to the temperature rise in the device due to the execution of the command.

At step 708, the total energy input associated with the executed commands is compared to a previously determined energy input to determine a change in temperature of the device between the two sampling periods. The change in temperature is calculated as an absolute change in temperature, disregarding whether the change is in a positive or negative direction. The impedance value associated with the termination resistors of the memory bus must be recalibrated to accommodate changes in temperature regardless of whether the change is an increase or a decrease in temperature.

At step 710, the change in temperature, as determined from the commands in the current tally and the stored total energy input value, is fed into a decision box where it is compared to a threshold value which may be programmed or set. If the change in temperature is greater than the threshold (line 711), the accumulator sends a calibration command to a calibration engine at step 714, and saves the total energy input as a new stored total energy input value at step 716.

If the change in temperature is less than the threshold (line 712), at step 718 the accumulator records a second tally of commands of various types in a second sampling period. At step 720, the accumulator then determines a second total energy input value of the commands in the second tally. At step 722, the accumulator compares the added total energy input value to the stored total energy input value (as used in step 708) to determine a second temperature change.

At step 724, the second temperature change is fed into a decision box where it is compared to the threshold value. If the second temperature change is larger than the threshold, the process continues to step 714, sending a calibration command to the calibration engine and setting the second temperature change as the new stored total energy input value at step 716.

If the second temperature change is less than the threshold, the process begins again from step 718, recording a third tally of commands for a third sampling period and continuing to step 720.

By using an average current and time for execution to determine an energy input of commands executed by the device within a sampling period, the temperature of the device can be accurately estimated and used to determine an optimal I/O impedance recalibration schedule. Recalibration commands can be sent to the calibration engines when necessitated by substantial changes in temperature of the device. Prompted calibration of impedance I/O values can be transmitted when required and when the temperature is not changing, the calibration commands can be sent less often saving power and keeping the bus clear for commands.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

What is claimed is:

1. A memory system comprising:
    a memory having an input/output ("I/O") terminal, the I/O terminal having an associated termination impedance;
    a calibration engine configured to change the termination impedance of the I/O terminal based on an impedance calibration command;
    a memory controller communicatively coupled by a channel to the I/O terminal and configured to transmit a first plurality of commands over the channel to the memory, the memory controller further configured to:
        estimate a first total energy consumed based on the first plurality of commands during a first sampling period;
        determine a first temperature change of the memory based on the first total energy consumed in the first sampling period and a previous total energy consumed in a previous sampling period; and
        transmit the impedance calibration command to the calibration engine if the first temperature change of the memory exceeds a first threshold.

2. The memory system of claim 1, wherein the memory controller is further configured to store the first temperature change as a new threshold.

3. The memory system of claim 1, wherein if the first temperature change does not exceed the first threshold, the memory controller is configured to:
    estimate a second temperature change of the memory based on a second plurality of commands during a second sampling period compared to the previous total energy consumed in the previous sampling period; and
    transmit the impedance calibration command to the calibration engine if the second temperature change exceeds the first threshold.

4. The memory system of claim 1, wherein the first total energy consumed is calculated from a tally of the first plurality of commands, an average current for each of the plurality of commands, and a time for each of the first plurality of commands.

5. The memory system of claim 4, wherein the memory controller includes a stored table of the average or peak current for each of the plurality of commands.

6. The memory system of claim 5, wherein the average or peak current for a particular command of the plurality of commands is programmable.

7. The memory system of claim 6, wherein the estimation of the first total energy consumed includes a heat dissipation component.

8. The memory system of claim 1, wherein the first total energy consumed is estimated from a weighted average temperature change associated with each command of the first plurality of commands.

9. The memory system of claim 1, wherein the memory controller transmits the impedance calibration command over a sideband channel and via a special command on the sideband channel.

10. The memory system of claim 1, wherein the impedance calibration command is a short calibration command (ZQCS).

11. The memory system of claim 1, wherein a long calibration command (ZQCL) is transmitted to the calibration engine if the first temperature change exceeds the first threshold and a second threshold.

12. The memory system of claim 1, wherein the calibration engine is configured to execute a periodic background calibration of the I/O terminal.

13. The memory system of claim 1, wherein the calibration engine is configured to change the impedance of the I/O terminal on a controller-side of the channel.

14. The memory system of claim 1, wherein the calibration engine is configured to change the impedance of the I/O terminal on a memory-side of the channel.

15. A method of calibrating I/O impedances using an estimation of temperature, the method comprising:
    recording, at a memory controller, a tally of commands transmitted to a memory within a sampling period;
    receiving a signal that the sampling period is complete;
    determining, at the memory controller, a total energy consumed associated with the transmitted commands in the tally;
    determining a temperature change based on the total energy consumed compared to a previous total energy consumed in a previous sampling period;
    transmitting a calibration command to a calibration engine if the temperature change exceeds at least one threshold value.

16. The method of claim 15, wherein determining the total energy consumed comprises integrating an average or peak current for each of the transmitted commands in the tally and a time period for each of the commands.

17. The method of claim 16, wherein determining the total energy consumed further comprises subtracting a heat dissipation component.

18. The method of claim 15, wherein transmitting the calibration command to the calibration engine includes transmitting the calibration command over a sideband channel and via a special command on the sideband channel.

19. The method of claim 15, wherein transmitting the calibration command to the calibration engine includes transmitting a short calibration command (ZQCS) if the temperature change exceeds a first threshold but does not exceed a second threshold.

20. The method of claim 15, further comprising transmitting a long calibration command (ZQCL) to the calibration engine if a temperature difference exceeds a first threshold and a second threshold.

* * * * *